United States Patent [19]

Matsui et al.

[11] Patent Number: 4,772,082

[45] Date of Patent: Sep. 20, 1988

[54] SEMICONDUCTOR LASER ARRAY DEVICE

[75] Inventors: Sadayoshi Matsui, Tenri; Mototaka Taneya, Nara; Mitsuhiro Matsumoto, Tenri, all of Japan

[73] Assignee: Sharp Kabushiki Kaisha, Osaka, Japan

[21] Appl. No.: 876,223

[22] Filed: Jun. 19, 1986

[30] Foreign Application Priority Data

Jun. 25, 1985 [JP] Japan .................. 60-140048

[51] Int. Cl.⁴ .................. G02B 6/10; H01S 3/19
[52] U.S. Cl. .................. 350/96.12; 350/96.14; 372/50
[58] Field of Search .............. 350/96.11, 96.12, 96.13, 350/96.14, 96.31; 372/46, 48, 49, 50

[56] References Cited

U.S. PATENT DOCUMENTS

| 3,806,830 | 4/1984 | Yonezo ................. 331/94.5 |
| 3,943,462 | 3/1976 | Thompson .............. 331/94.5 |
| 4,255,717 | 3/1981 | Scifres et al. .......... 331/94.5 |
| 4,337,443 | 6/1982 | Umeda et al. ........... 372/49 |
| 4,536,940 | 8/1985 | Henry et al. ........... 372/46 X |
| 4,594,718 | 6/1986 | Scifres et al. ......... 372/50 X |
| 4,603,421 | 7/1986 | Scifres et al. ......... 350/96.16 X |
| 4,624,000 | 11/1986 | Streifer et al. ........ 372/46 X |
| 4,641,311 | 2/1987 | Ackley ................. 372/50 X |

FOREIGN PATENT DOCUMENTS

| 0055595 | 4/1980 | Japan ................. 372/49 |
| 0138888 | 10/1980 | Japan ................. 372/46 |

OTHER PUBLICATIONS

"Reduction of GaAs Diode Laser Spontaneous Emission", by Streifer et al., Appl. Phys. Lett. 37(1), (Jul. 1, 1980).
"$Al_2O_3$ Half-Wave Films for Long-Life CW Lasers", by Ladany et al., Appl. Phys. Lett., vol. 30, No. 2, Jan. 15, 1977.
IBM Tech Disclosure Bulletin, 1978, vol. 21, No. 4, pp. 1686–1687.
Appl. Phys. Lett., 1983, vol. 43, No. 12, pp. 1096–1098.

Primary Examiner—William L. Sikes
Assistant Examiner—Akm E. Ullah
Attorney, Agent, or Firm—Ciotti & Murashige, Irell & Manella

[57] ABSTRACT

A semiconductor laser array device comprising a plurality of index-guided active waveguides optically and smoothly coupled with each other in a parallel manner, wherein the reflective index of the center area of at least one facet of said semiconductor laser array device corresponding to said active waveguides is higher than that of the other area of said facet corresponding to said active waveguides.

6 Claims, 3 Drawing Sheets

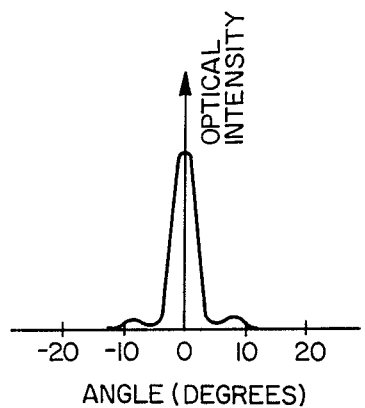
FIG. 4
FIG. 5a
PRIOR ART
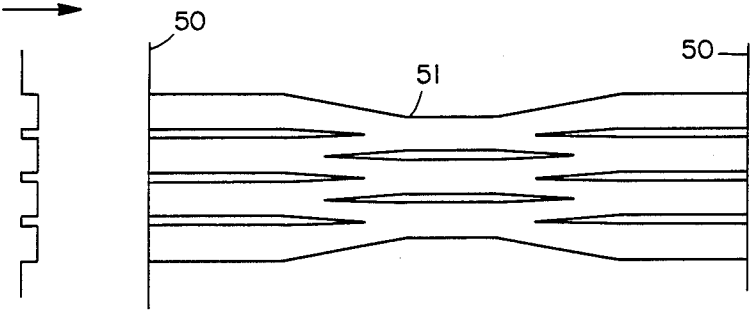
FIG. 5b
PRIOR ART

0°-PHASE SHIFT MODE

MEDIAL PHASE MODE

MEDIAL PHASE MODE

180°-PHASE SHIFT MODE

SEMICONDUCTOR LASER ARRAY DEVICE

BACKGROUND OF THE INVENTION

1. Field of the Invention

This invention relates to a semiconductor laser array device which oscillates high output power laser lights with a 0°-phase shift therebetween.

2. Background Art

Semiconductor laser devices having a single lasing filament structure can only produce 50 mW lights at their best. In order to produce high output power, semiconductor laser devices, in which a plurality of lasing filaments are disposed in a parallel manner on a single substrate to achieve an optical coupling between the adjacent lasing filaments, have been studied.

In the case where a plurality of index-guided semiconductor laser devices are disposed in a parallel manenr with an optical phase coupling between the adjacent lasing filaments and the individual laser devices have the same gain, they tend to oscillate laser lights with a 180°-phase shift therebetween rather than with a 0°-phase shift therebetween. This is because the electric field distribution is in accord with the gain distribution in the 180°-phase shift mode rather than in the 0°-phase shift mode, resulting in a small oscillation threshold gain in the 180°-phase shift mode. In order to prevent this phenomenon, the oscillation threshold gain in the 180°-phase shift mode must be made great to suppress the 180°-phase shift mode. For this purpose, as shown in FIG. 5(a), a semiconductor laser array having a structure with branching and combining type waveguides 51 on both facets 50 has been proposed. The basic operation of this laser array device is as follows: Lights, which are propagated with a 0°-phase shift therebetween in the branching waveguides, proceed to the combining waveguides with the same phase, so that the lights are intensified. On the contrary, when lights, which are propagated with a 180°-phase shift therebetween in the branching waveguides, proceed to the combining waveguides, they exhibit a reciprocal phase with each other, so that the lights are extremely weakened, resulting in a radiant mode in which the lights radiate outside of the waveguide. In such a manner, the lights with a 180°-phase shift therebetween undergo loss, resulting in an increase in oscillation threshold gain in the 180°-phase shift mode.

However, oscillation threshold gain in the medial mode between the 0°-phase shift mode and the 180°-phase shift mode is reduced with an increase in the number of the waveguides, so that oscillation in the 0°-phase shift mode cannot be achieved. For example, FIGS. 6(a) to 6(d) show the distributions of electric field E with regard to the 0°-phase shift mode (a), the 180°-phase shift mode (d), and each of the medial modes (b) and (c) therebetween, respectively, in a laser array shown in FIG. 5(b). It can be seen from FIGS. 6(a) to 6(d) that the electric field distribution of laser lights in the 0°-phase shift mode exhibits peaks in the center, while the electric field distributions of laser lights in the other modes (b), (c) and (d) exhibit peaks on both sides.

The far-field pattern of laser lights with a 0°-phase shift therebetween produced by conventional semiconductor laser array devices exhibits a single peak so that the laser lights can be concentrated into a spot by means of optical lenses, whereas the farfield pattern of laser lights with a 180°-phase shift therebetween or each of the medial modes between the 0°-phase shift mode and the 180°-phase shift mode exhibits dual peaks so that the laser lights cannot be concentrated into a spot by any optical lens. These semiconductor laser array devices producing laser lights which cannot be concentrated into a spot are inconvenient in an optical coupling with other optical systems, and cannot be used as light sources for optical communication, optical disc systems, etc.

Thus, creation of a semiconductor laser array device oscillating laser lights with a 0°-phase shift therebetween (i.e., attaining higher oscillation gain in the 0°-phase shift mode than in the 180°-phase shift mode and in the medial modes), which can thereby be utilized as a light source for optical communication, is required.

SUMMARY OF THE INVENTION

The semiconductor laser array device of this invention, which overcomes the above-discussed and numerous other disadvantages and deficiencies of the prior art, comprises a plurality of index-guided active waveguides optically and smoothly coupled with each other in a parallel manner, wherein the reflective index of the center area of at least one facet of said semiconductor laser array device corresponding to said active waveguides is higher than that of the other area of said facet corresponding to said active waveguides.

In a preferred embodiment, a limited thickness of each of the layers of a single- or multiple-layered reflecting film on said facet which is composed of an $Al_2O_3$ single layered film or an $Al_2O_3$ multilayered film, and/or in $Al_2O_3$-amorphous Si film, creates a reflective index of said facet in the range of approximately 2% to 95%.

In a preferred embodiment, the high reflective index of said facet is attained by the formation of a reflecting film composed of $Al_2O_3$ double-layers in the center area of said facet corresponding to the active waveguides and the low reflective index of said facet is attained by the formation of a reflecting film composed of an $Al_2O_3$ single-layer in the other area of said facet corresponding to the active waveguides.

The thickness of said $Al_2O_3$ double-layered reflecting film and said $Al_2O_3$ single-layered reflecting film are, in a preferred embodiment, $2\lambda/4$ and $\lambda/4$ ($\lambda$ is the oscillation wavelength), respectively, resulting in the reflective indexes of approximately 32% and approximately 2%, respectively.

Thus, the invention described herein makes possible the ojbects of (1) providing a semiconductor laser array device having a plurality of index-guided semiconductor lasers in a parallel manner with an optical phase coupling between the adjacent laser filaments on the same substrate, which attains a 0°-phase shift between the adjacent lasing filaments, resulting in high output power laser lights with the radiation pattern of a single peak; and (2) providing a semiconductor laser array device in which the reflective index of the center area of at least one facet thereof corresponding to active waveguides is higher than that of the other area in the facet corresponding to the active waveguides so that oscillation threshold gain in the 0°-phase shift mode can be made smaller than that of other array modes, whereby laser lights with a 0°-phase shift therebetween can be stably oscillated and concentrated into a single spot, allowing the production of excellent resolution optical machinery utilizing laser lights.

BRIEF DESCRIPTION OF THE DRAWINGS

This invention may be better understood and its numerous objects and advantages will become apparent to those skilled in the art by reference to the accompanying drawings as follows:

FIG. 4 is a diagram showing the optical intensity distribution of laser lights from the laser array device of this invention.

FIGS. 5(a) and 5(b), respectively, are diagrams showing the branching and combining type optical waveguides of a conventional semiconductor laser array device.

DESCRIPTION OF THE PREFERRED EMBODIMENTS

Figure 1:
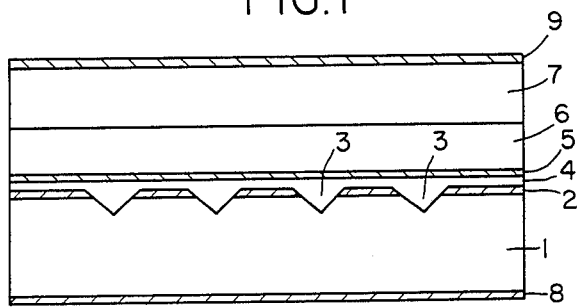
FIG. 1 is a front sectional view showing a semiconductor laser array device of this invention.

FIG. 1 shows a GaAs-GaAlAs semiconductor laser array device having a flat active layer of this invention, which is produced as follows: On a p-GaAs substrate 1, an n-GaAs current blocking layer 2 is formed by a crystal growth technique such as liquid phase epitaxy, etc. Then, V-channels 3 are formed in the current blocking layer 2 by photolithography and an etching technique in a manner to reach the substrate 1, resulting in current paths. Then, on the current blocking layer 2 including the V-channels 3, a p-$Al_xGa_{1-x}As$ cladding layer 4, a p- or n- $Al_yGa_{1-y}As$ active layer 5, an n-$Al_xGa_{1-x}As$ cladding layer 6, and an n+ cap layer 7 are successively grown by liquid phase epitaxy (wherein x>y), resulting in a double-heterostructure multi-layered growth crystal for laser oscillation. Then, a p-ohmic contact 8 and an n-ohmic contact 9, are formed on the back face of the substrate 1 and the upper face of the cap layer 7, respectively, followed by cleaving at right angles to the V-channels 3 to form a laser array device unit having an internal cavity length of 200–300 μm.

Figure 2:
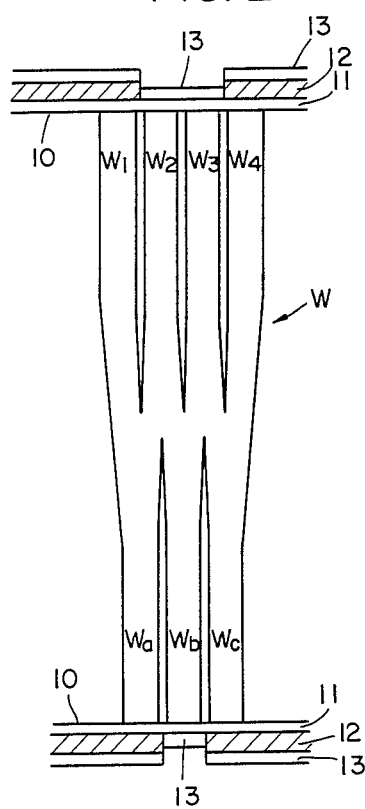
FIGS. 2 and 3 are plane view showing a process for the production of reflectng films on the facets of the laser array device shown in FIG. 1.

Then, a single- or multiple- layered reflecting film made of $Al_2O_3$ and/or amorphous Si is formed on each of both facets of the device by an electron beam evaporation process, resulting in laser reflectors on both facets. The thickness of each of the layers of the reflecting film composed of an $Al_2O_3$ single layered film or an $Al_2O_3$-amorphous Si multilayered film should be set at an appropriate value, so that the reflective index of the reflecting film will be at a value ranging from approximately 2% to 95%. According to this example, the reflective index of one reflecting film composed of an $Al_2O_3$ single layered film having a thickness of $\lambda/4$ ($\lambda$ is the oscillation wavelength) is approximately 2% and the reflective index of the other reflecting film composed of an $Al_2O_3$ double-layered film having a thickness of $2\lambda/4$ ($\lambda$ is the oscillation wavelength) is approximately 32%. In order to obtain these reflecting films, as shown in FIG. 2, an $Al_2O_3$ film 11 having a thickness of $\lambda/4$ is formed on each of both facets 10 of the laser device by electron-beam vapor deposition, and then resist films 12 are formed on the areas of the $Al_2O_3$ films 11 of the facets 10 corresponding to the active waveguides $W_1$, $W_4$, Wa and Wc by photolithography.

Figure 3:
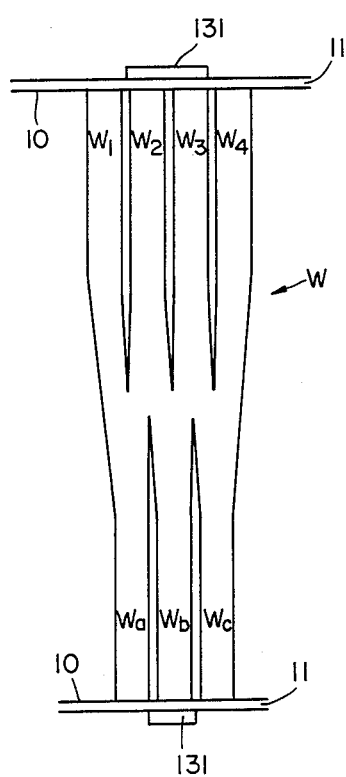

Thereafter, an $Al_2O_3$ film 13 having a thickness of $\lambda/4$ is formed on both the $Al_2O_3$ film 11 and the resist films 12 on each of both facets 10 by the same vapor deposition as mentioned above. Then, as shown in FIG. 3, the resist films 12 are removed by a remover, resulting in an $Al_2O_3$ film 131 with a thickness of $2\lambda/4$ (the reflective index thereof being 32%) on the center area of each of both facets 10 corresponding to the active waveguides $W_2$ & $W_3$, and Wb, and an $Al_2O_3$ film 11 with a thickness of $\lambda/4$ (the reflective index being 2%) on the outskirts of each of both facets 10 corresponding to the active waveguides $W_1$ & $W_4$, and Wa & Wc. These reflecting films 11 and 131 on each of the facets 10 form a resonator reflector.

Figure 6A:
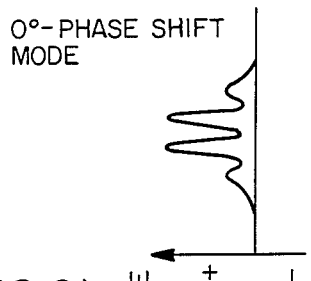
FIGS. 6(a) to 6(d), respectively, are diagrams showing the electric field distribution of each of the phase shift modes in the conventional laser array device shown in FIG. 5(b).
Figure 6A:
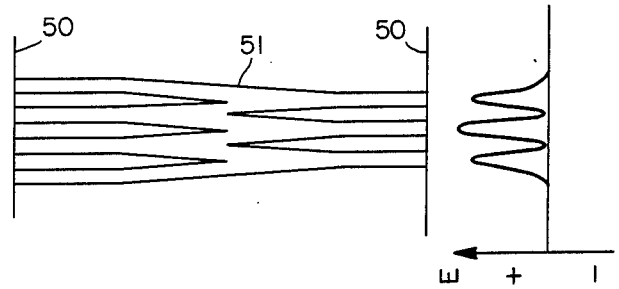
Figure 6B:
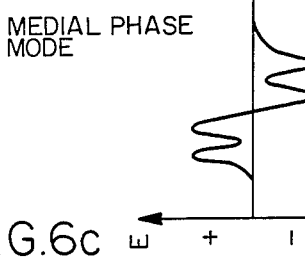
Figure 6B:
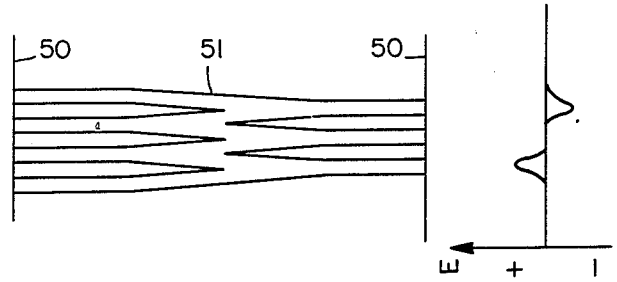
Figure 6C:
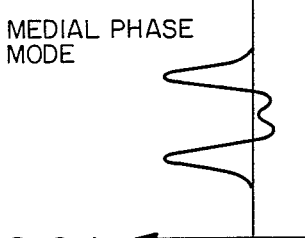
Figure 6C:
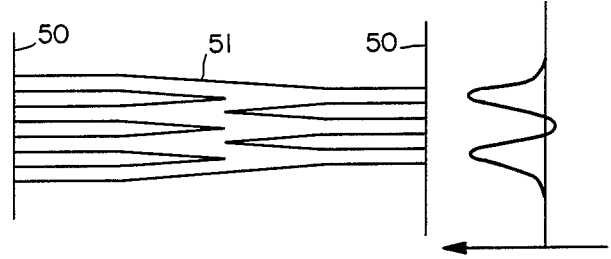
Figure 6D:
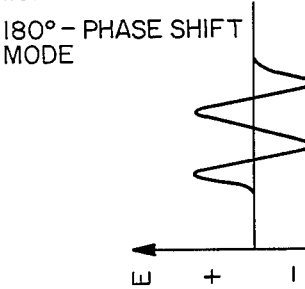
Figure 6D:
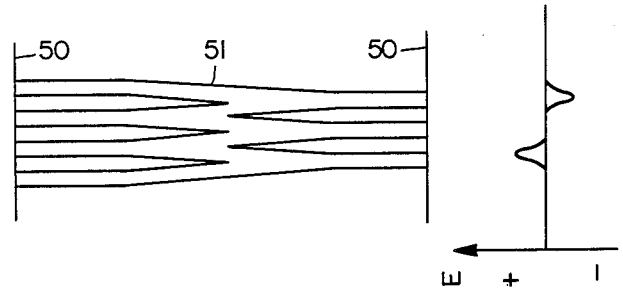

As mentioned above, by the formation of these different dielectric films on both facets 10, the reflective index of the center area of each of both facets 10 corresponding to the active waveguides W becomes high, whereas that of the outskirts of each of both facets 10 corresponding to the active waveguides W becomes low. Accordingly, loss of light in the 0°-phase shift mode due to the resonator reflector is suppressed because the electric field distribution is concentrated in the center area of the active waveguides W as shown in FIG. 6(a), while loss of light in the other array modes due to the resonator reflector is great because the electric field distributions are concentrated in the outskirts of the active waveguides W as shown in FIGS. 6(b) to 6(d). As a result, loss of light in the 0°-phase shift mode becomes smaller than that of light in the other array modes, and the oscillation threshold gain in the 0°-phase shift mode also becomes small, so that, as shown in FIG. 4, the laser device can stably oscillate laser light with a 0°-phase shift therebetween. Although a more stable 0°-phase shift mode can be attained when the active waveguides are optically coupled therebetween with an evanescent wave arising between the adjacent active waveguides, if these active waveguides are uniformly formed, optical coupling therebetween using such an evanescent wave will not necessarily required.

A semiconductor laser array device having the active waveguide structure shown in FIG. 5(b) was produced wherein the width We of each of the active waveguides was 4 μm, the distance Ws between the adjacent active waveguides was 1 μm, the reflective index of the center area of each of both facets corresponding to the active waveguides was 32%, and the reflective index of the other area of each of both facets corresponding to the active waveguides was 2%. This laser device oscillated in a 0°-phase shift mode up to an output power of 130 mW at an oscillation threshold current in the range of 120 to 150 mA, and laser oscillation in the other array modes was suppressed.

The semiconductor laser array device of this invention is, of course, applicable not only to the above-mentioned index-guided structures, but also to other index-guided structures including ridged type, buried type, etc. This invention is also applicable not only to semiconductor lasers using GaAlAs-GaAs systems, but also to those using InP-InGaAsP systems, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser array device comprising a plurality of index-guided active waveguides optically and smoothly coupled with each other in a parallel manner, wherein the reflectivity of the center area of at least one facet of said semiconductor laser array device corresponding to said active waveguides is higher than that of the other area of said facet corresponding to said active waveguides.

2. A semiconductor laser array device according to claim 1, wherein a limited thickness of each of the layers of a reflecting film on said facet which is composed of an $Al_2O_3$ single layered film, an $Al_2O_3$ multi-layered film, an $Al_2O_3$-amorphous Si film, or a combination thereof, creates a reflectivity of said facet in the range of approximately 2% to 95%.

3. A semiconductor laser array device according to claim 1, wherein the high reflectivity of said facet is attained by the formation of a reflecting film composed of $Al_2O_3$ double-layers in the center area of said facet corresponding to the active waveguides and the low reflectivity of said facet is attained by the formation of a reflecting film composed of an $Al_2O_3$ single-layer in the other area of said facet corresponding to the active waveguides.

4. A semiconductor laser array device according to claim 3, wherein the thickness of said $Al_2O_3$ double-layered reflecting film and said $Al_2O_3$ single-layered reflecting film are $2\lambda/4$ and $\lambda/4$ ($\lambda$ is the oscillation wavelength), respectively, resulting in the reflectivities of approximately 32% and approximately 2%, respectively.

5. A semiconductor laser array device according to claim 2, wherein the high reflectivity of said facet is attained by the formation of a reflecting film composed of $Al_2O_3$ double-layers in the center area of said facet corresponding to the active waveguides and the low reflectivity of said facet is attained by the formation of a reflecting film composed of an $Al_2O_3$ single-layer in the other area of said facet corresponding to the active waveguides.

6. A semiconductor laser array device according to claim 5, wherein the thickness of said $Al_2O_3$ double-layered reflecting film and said $Al_2O_3$ single-layered reflecting film are $2\lambda/4$ and $\lambda/4$ ($\lambda$ is the oscillation wavelength), respectively, resulting in the reflectivities of approximately 32% and approximately 2%, respectively.

* * * * *